(12) United States Patent
Bhavnagarwala et al.

(10) Patent No.: US 7,968,450 B2
(45) Date of Patent: Jun. 28, 2011

(54) METHODS FOR INCORPORATING HIGH DIELECTRIC MATERIALS FOR ENHANCED SRAM OPERATION AND STRUCTURES PRODUCED THEREBY

(75) Inventors: Azeez J. Bhavnagarwala, Newtown, CT (US); Stephen V. Kosonocky, Wilton, CT (US); Satyanarayana V. Nitta, Poughquag, NY (US); Sampath Purushothaman, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/543,999

(22) Filed: Aug. 19, 2009

(65) Prior Publication Data

US 2010/0041227 A1 Feb. 18, 2010

Related U.S. Application Data

(62) Division of application No. 10/988,484, filed on Nov. 12, 2004.

(51) Int. Cl.
*H01L 21/768* (2006.01)
(52) U.S. Cl. ............................. 438/624; 257/E21.576

(58) Field of Classification Search .................. None
See application file for complete search history.

(56) References Cited

U.S. PATENT DOCUMENTS

| | | | |
|---|---|---|---|
| 5,314,839 A * | 5/1994 | Mizutani et al. | 438/396 |
| 5,548,159 A | 8/1996 | Jeng | |
| 6,495,918 B1 | 12/2002 | Britzinger | |
| 6,657,302 B1 | 12/2003 | Shao | |
| 6,777,320 B1 | 8/2004 | Chiang | |
| 2002/0005584 A1 | 1/2002 | Domae | |
| 2002/0056885 A1 | 5/2002 | Kita et al. | |
| 2002/0102807 A1 | 8/2002 | Kim | |
| 2007/0096319 A1 * | 5/2007 | Hsu et al. | 257/750 |
| 2008/0122121 A1 * | 5/2008 | Suda et al. | 257/784 |

* cited by examiner

*Primary Examiner* — Benjamin P Sandvik
(74) *Attorney, Agent, or Firm* — Daniel P. Morris; Anne Vachon Dougherty

(57) ABSTRACT

Methods for fabricating a hybrid interconnect structure that possesses a higher interconnect capacitance in one set of regions than in other regions on the same microelectronic chip. Several methods to fabricate such a structure are provided. Circuit implementations of such hybrid interconnect structures are described that enable increased static noise margin and reduce the leakage in SRAM cells and common power supply voltages for SRAM and logic in such a chip. Methods that enable combining these circuit benefits with higher interconnect performance speed and superior mechanical robustness in such chips are also taught.

12 Claims, 10 Drawing Sheets

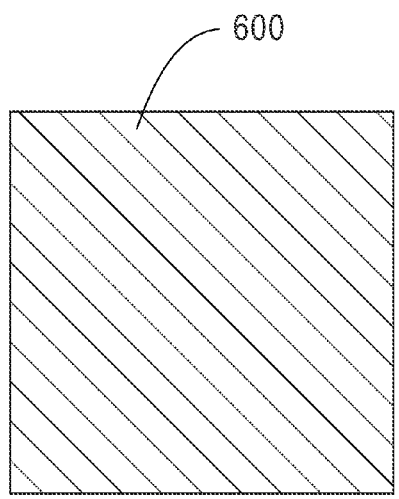
FIG. 7.1
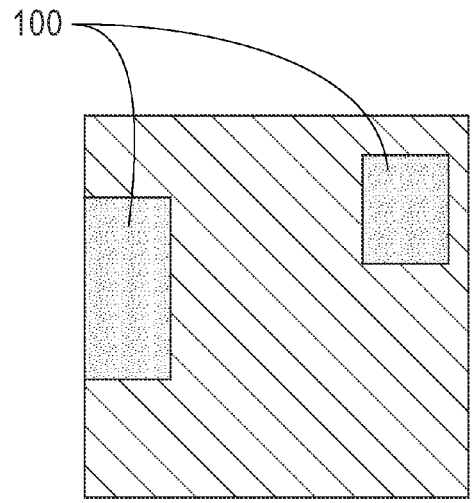
FIG. 7.2
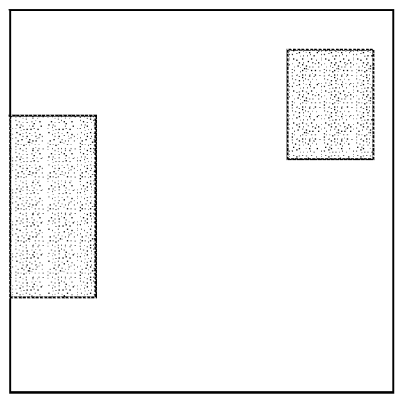
FIG. 7.3
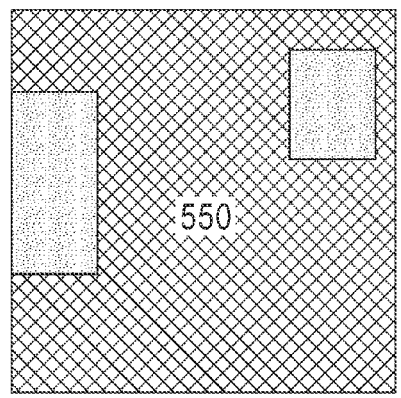
FIG. 7.4
FIG. 7

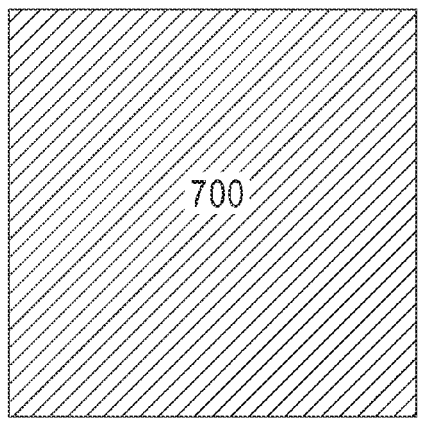
FIG. 8.1
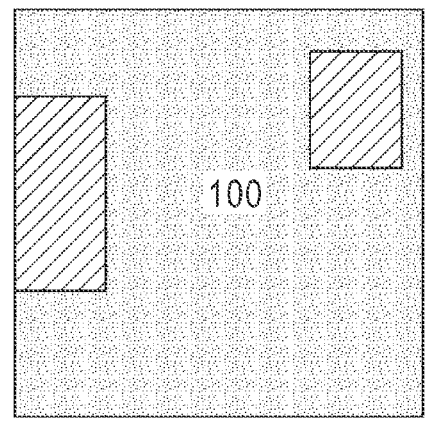
FIG. 8.2
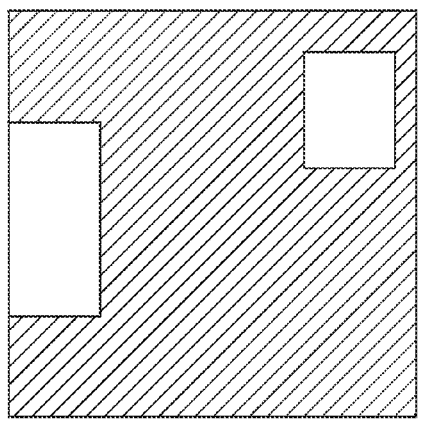
FIG. 8.3
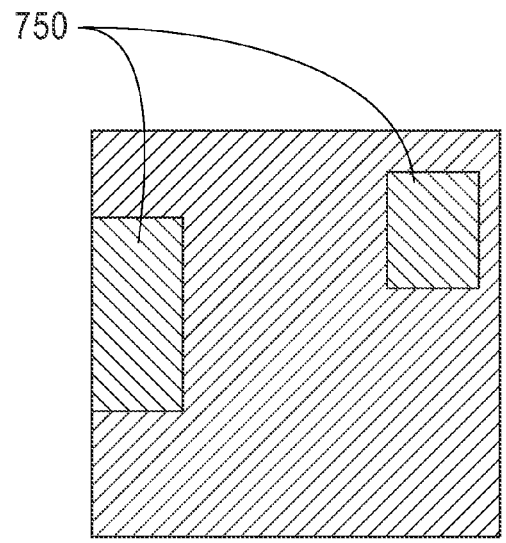
FIG. 8.4
FIG. 8

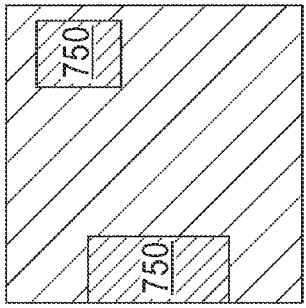
FIG. 9.4
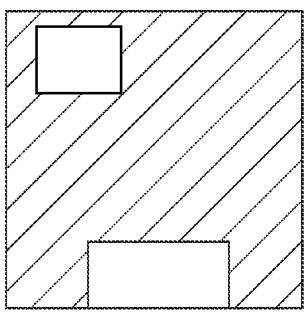
FIG. 9.3
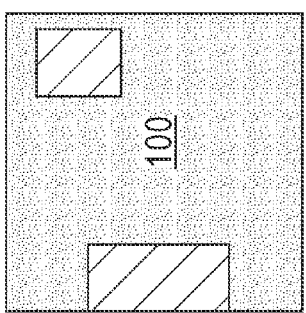
FIG. 9.2
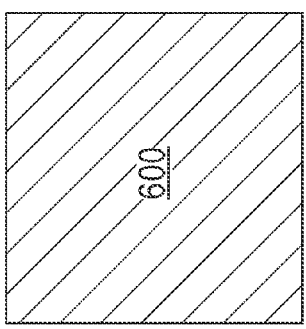
FIG. 9.1
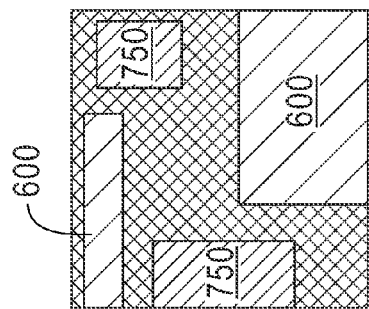
FIG. 9.7
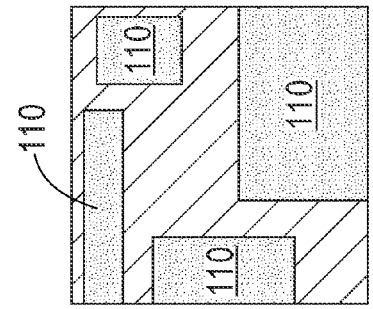
FIG. 9.6
FIG. 9.5
FIG. 9

METHODS FOR INCORPORATING HIGH DIELECTRIC MATERIALS FOR ENHANCED SRAM OPERATION AND STRUCTURES PRODUCED THEREBY

CROSS REFERENCE TO RELATED APPLICATIONS

This is a divisional application of U.S. patent application Ser. No. 10/988,484, filed Nov. 12, 2004.

FIELD OF THE INVENTION

This invention pertains to the formation of back end of the line (BEOL) interconnect structures for advanced microelectronic chips of the type used in microprocessors, microcontrollers, communications, graphics and the like. In particular, methods pertinent to improving the performance of SRAM cells in such chips by enabling a higher capacitance interconnect environment selectively in the SRAM regions of such chips are described.

BACKGROUND

Limited by array leakage and read stability, CMOS SRAM cell device threshold voltages (VT) have scaled less aggressively than logic requiring a separate, higher supply voltage (VDD-CELL) to enable higher static noise margin (SNM) and read current (IREAD), and lower read current variability, in the presence of increasingly severe, random VT fluctuations in small geometry SRAM cell transistors. However, a second array of power supply translates into more input output (I/O) requirements and fewer metal wiring tracks for other chip functions such as power, global signal and clock distribution—all of which directly impact cost. Secondly, higher/dual cell power supplies result in (i) more leakage due to all components from unaccessed Subarrays of large L2 caches during active mode and (ii) more switching power, adversely impacting battery lifetime for portable applications as well as the cost of packaging for high performance desktop and server products.

Figure 1A:
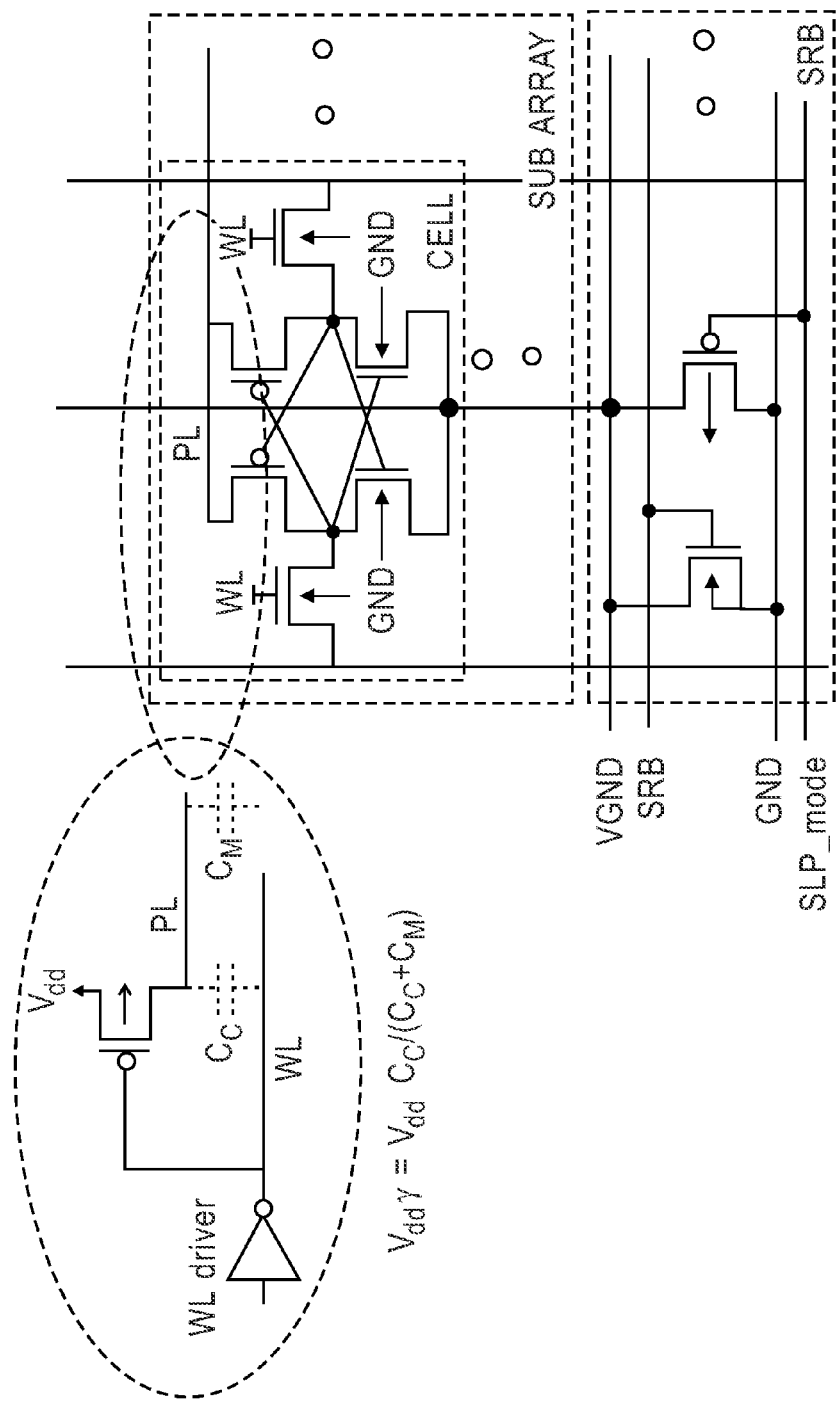
Figure 1B:
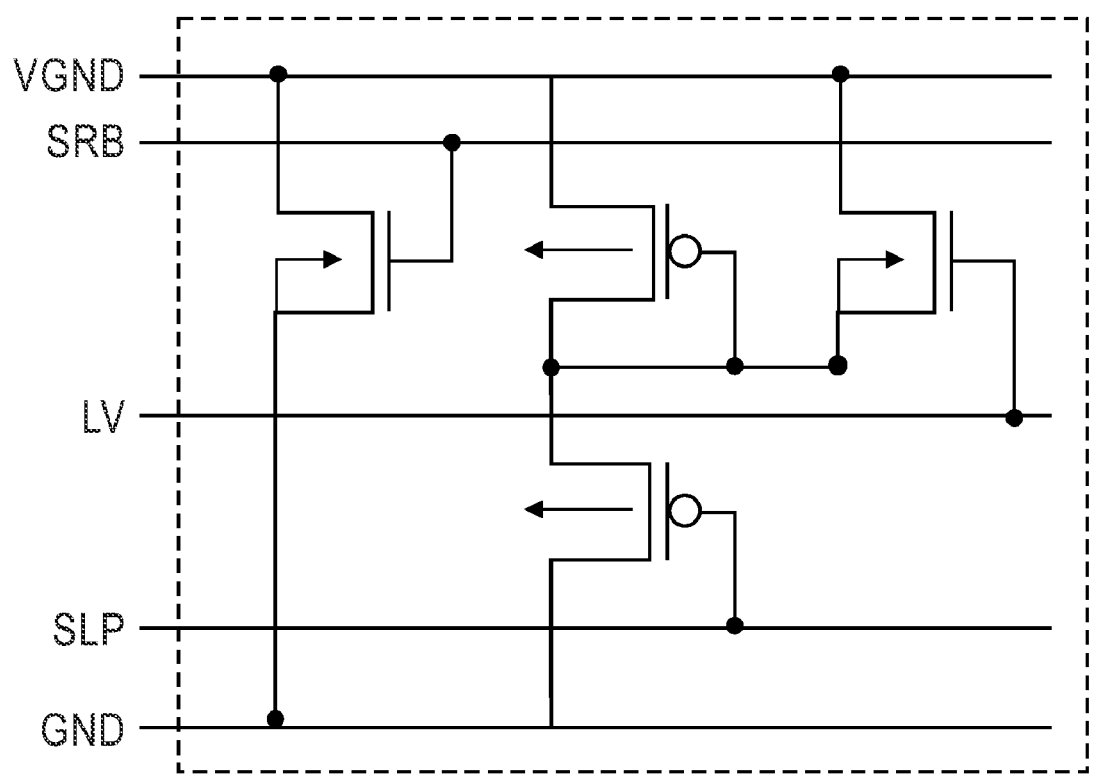
Figure 2:
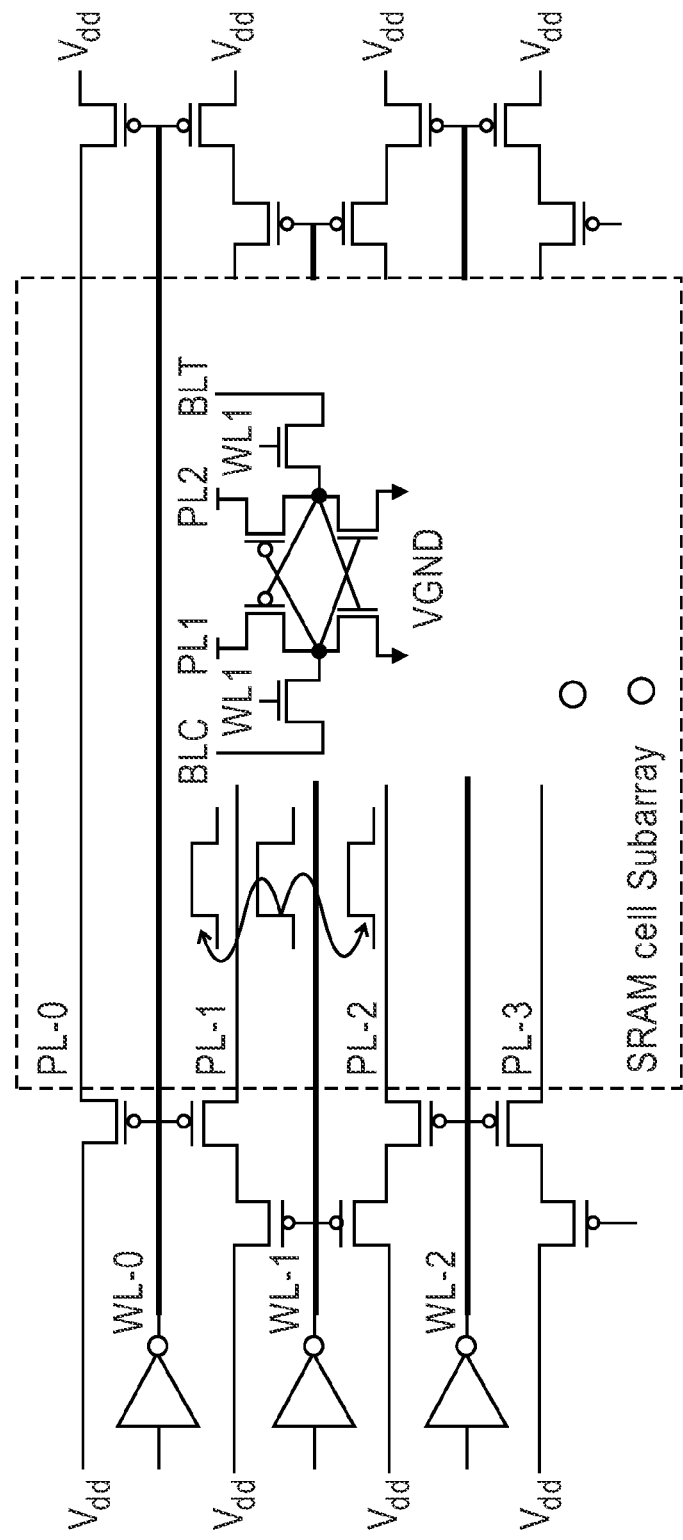
Figure 3:
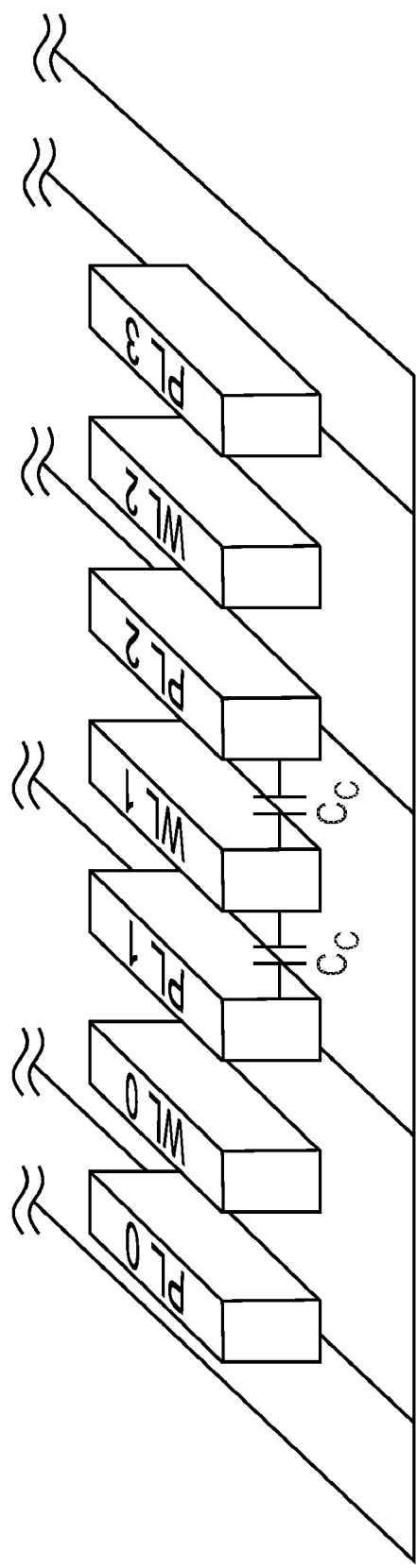

New circuit techniques were reported in a co-pending application YOR9200300292US1 by some of the present authors that enable a single VDD SRAM to operate at logic compatible voltages with a cell read current and cell static noise margin typically seen with higher/dual VDD SRAMs. The schematic circuit implementations are shown in FIGS. 1a, 1b and 2. FIG. 3 shows the physical implementation of the SRAM cell interconnects schematically where the array of word lines (WL) and the associated power lines (PL) are shown. Implemented in a 65 nm CMOS SOI process with no alterations to the CMOS processes and materials or to a conventional, single VT SRAM cell, the voltage across power rails of the selected SRAM cells self-biases to permit a higher-than-VDD voltage during word line (WL) active periods and a lower than 2VT voltage at all other times. Based on circuit simulations data, FIG. 4, this "bootstrapping" has been shown to increase the supply voltage by about 17% under this circuit implementation. Bootstrapping the cell row power supply and regulating the cell Subarray virtual ground voltage enables the above 'Transregional' SRAM operation resulting in near-subthreshold data storage and superthreshold access, lowering total leakage by over 10× and improving IREAD and SNM by 7% and 18% respectively with a total area overhead of less than 13%.

It is therefore clear that 'Transregional' SRAM operation enables logic VDD compatibility, lower leakage, and higher cell read stability without degradation of performance. The benefits of this bootstrapping effect can be significantly enhanced over those shown in prior art by enabling a stronger capacitive coupling between the WL that selects a row of SRAM cells and the power line (PL) pair that supply power to that row. Incorporation of a higher k dielectric material between the WL and PL lines in an SRAM subarray, to enable a stronger capacitive coupling between WL and PL is a way to achieve this end. However, using a higher k dielectric at other regions of the chip (areas of logic and interconnects) is detrimental to chip performance as increased capacitance in these regions translates to increased RC delay and hence slower interconnect speeds. In this invention, we teach a structure that enables higher capacitive coupling in the SRAM cell areas and lower capacitance elsewhere so as to overcome this problem. Several methods to fabricate such a structure are also taught.

Figure 5:
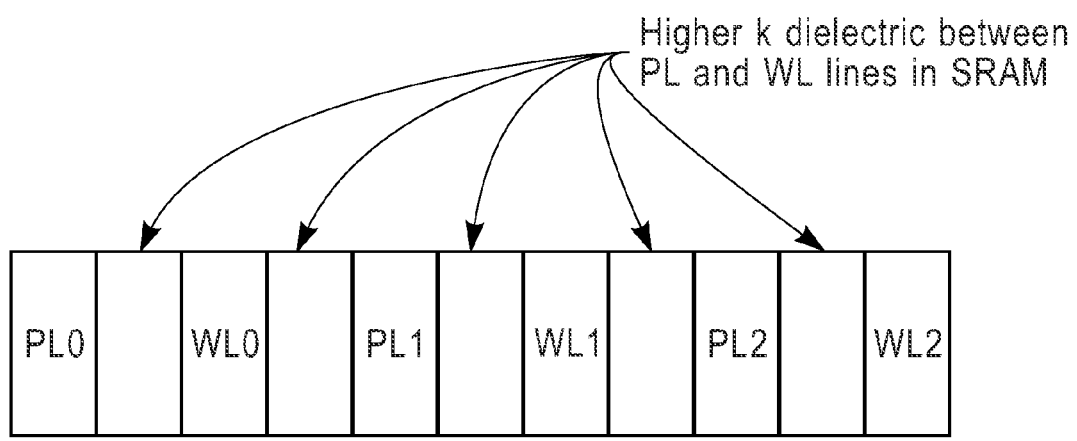

It is therefore an object of this invention to describe a chip interconnect structure that will enable a hybrid system of inter-metal dielectrics (IMD): a high k or ultra-high k dielectric in the inter-metal gaps between the WL and PL features, FIG. 5, while providing low k or ultra low k dielectric separating the interconnect lines elsewhere. For the purpose of convenience in the descriptions below we arbitrarily define high k as $7<k<4$ and ultra high k as $k>7$ and low k as $4<k<2.0$ and ultra low k as $k<2$. It is further the object of this invention to achieve the optimum benefits in the SRAM performance metrics as outlined above while maintaining the mechanical robustness of the chip and the low effective interconnect capacitance to minimize interconnect delay elsewhere on the chip. It is further an object of this invention to describe methods to fabricate the above described hybrid interconnect structure.

These and other aspects of our invention are described below in detail along with the following set of illustrative figures.

DESCRIPTION

FIG. 1. Schematic circuit diagram of a Transregional SRAM implementation showing PL bootstrapped to be above VDD and with VGND regulated with a PFET diode stack.

FIG. 2. Bootstrap approach shown schematically in circuit implementation form on PL.

FIG. 3. Physical implementation of a bootstrap on to a pair of PL lines.

Figure 4:
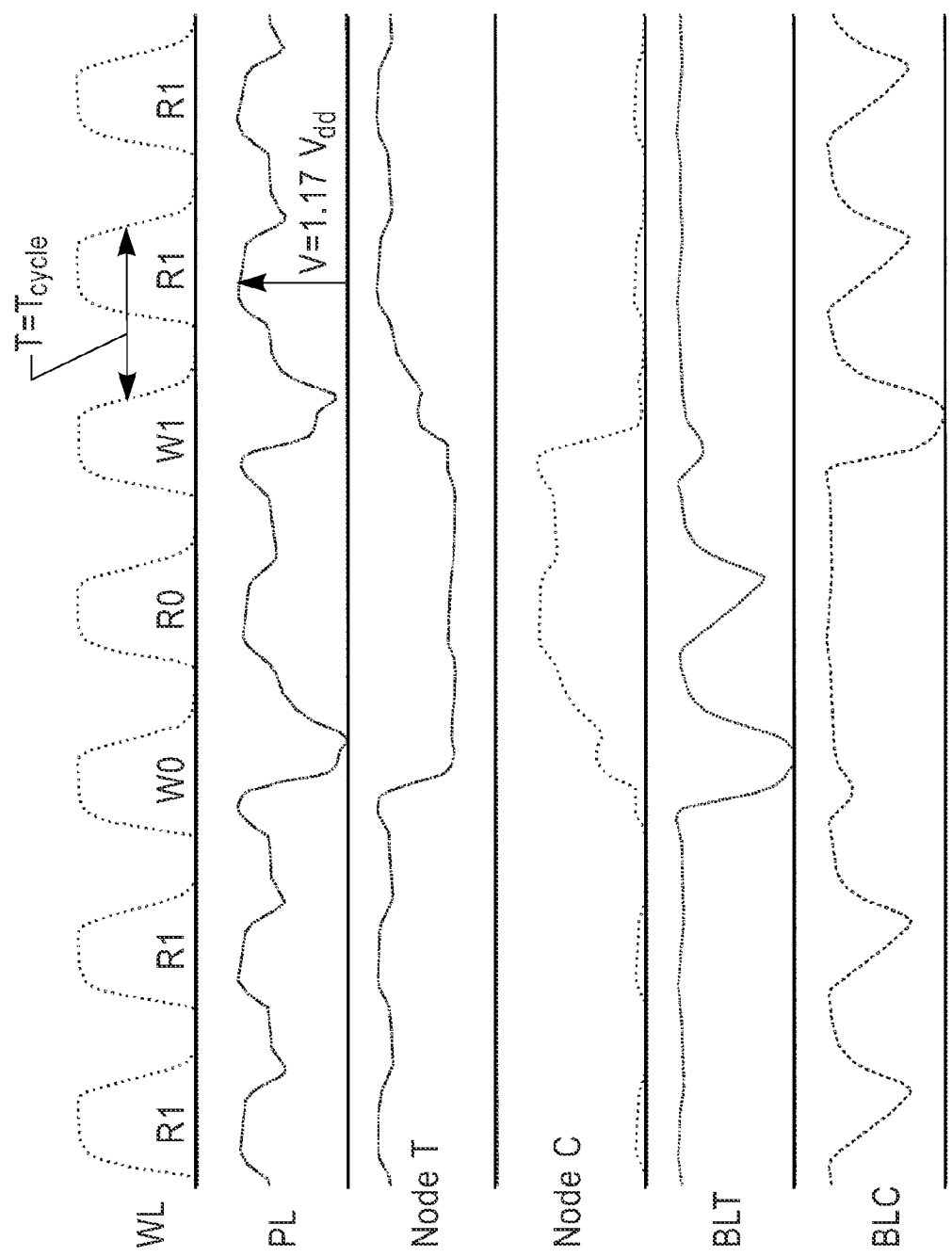

FIG. 4. Circuit simulations demonstrating Transregional SRAM operation with the bootstrap using the same insulating material between WL & PL as anywhere else.

FIG. 5. Proposed enhanced physical implementation of the bootstrap approach according to the present invention using higher k dielectric between WL and PL tracks and low k dielectric elsewhere in the chip area.

Figure 6:
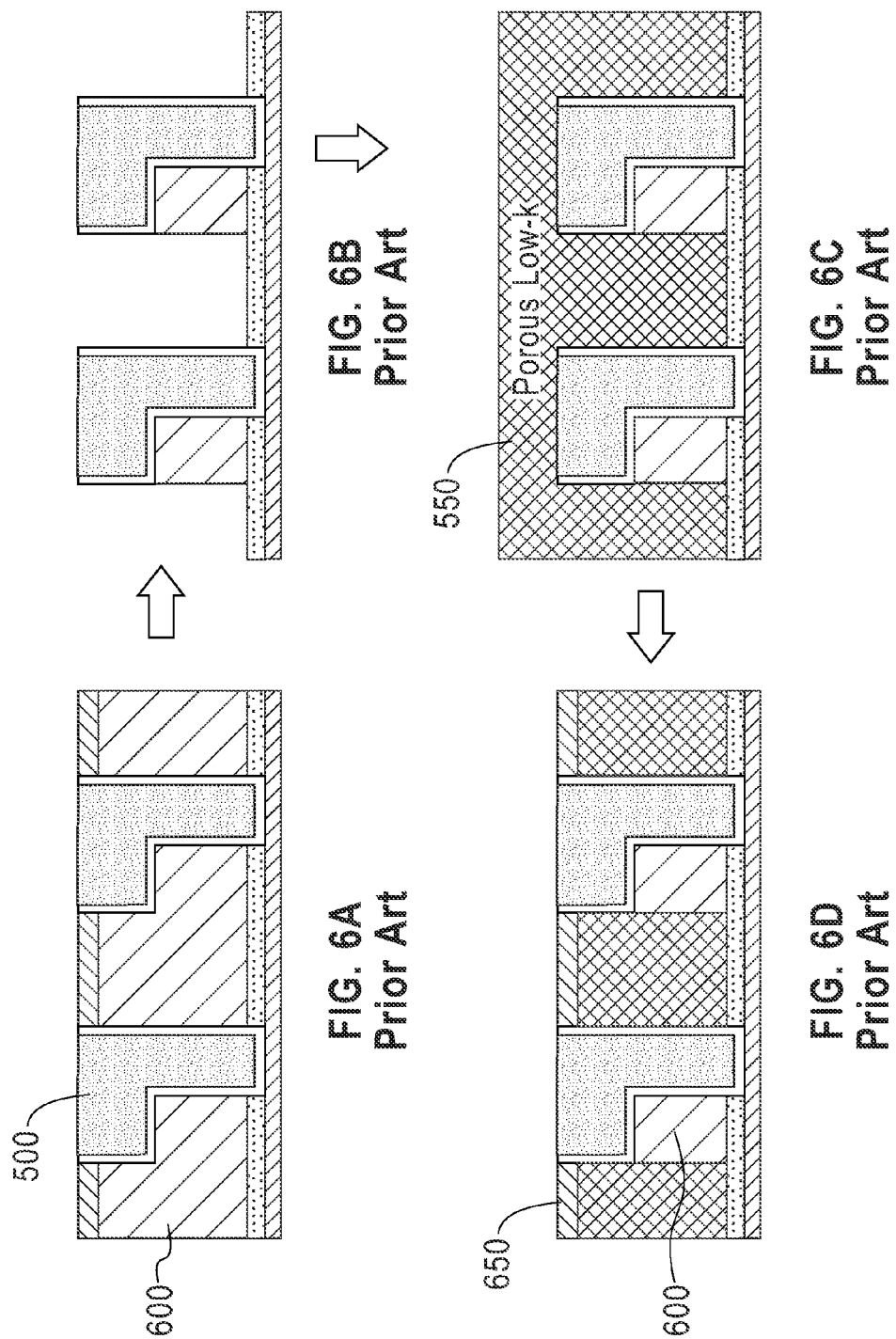

FIG. 6. Schematic description of the etch back and gap fill integration scheme.

FIG. 7. Schematic description of the first inventive method to fabricate the hybrid SRAM interconnect structure using EBGF and a block out lithography step.

FIG. 8. Schematic description of the second inventive process described below.

FIG. 9. Schematic description of the third inventive process described below.

DETAILED DESCRIPTION OF THE INVENTION

We teach the fabrication of the hybrid structure described above using an etch back and gap fill (EBGF) integration scheme (US Patent Application 200040087135A1 by some of the preset authors) or variants thereof.

In the EBGF scheme, schematically shown in FIG. 6, the interconnect wires 500 are first fabricated in a dense dielectric medium 600 (typically a material of higher k such as oxide, SiCOH, dense spin on glasses and the like), FIG. 6a. The dense dielectric is then etched from between the inter-line gaps using the lines themselves as an etch mask to produce the structure shown in FIG. 6b. Then a lower k dielectric (typically a low k or very low k dielectric material 550 often porous so as to have k values as low as 1.6) is deposited so as to overfill the etched recesses as shown in FIG. 6c. The structure is then planarized by a chem-mech polish (CMP) process and capped with a passivation dielectric 650 resulting in an EBGF structure shown in FIG. 6d. The dense dielectric 600 is considered a support dielectric and is used to provide mechanical robustness as the low k IMD 550 is usually mechanically fragile.

In the first inventive method, depicted schematically in FIG. 7, the EBGF method is used in conjunction with a simple block out lithography step that protects the SRAM cell regions where WL and PL lines are located with a photoresist mask so that the dense dielectric is left in tact between these lines. FIG. 7.1 shows the top down view of the structure after the standard build in a dense and robust BEOL dielectric 600. Interconnect lines are not shown for the sake of simplicity. Following this, as shown in FIG. 7.2, the SRAM cell regions are protected by photoresist 100 using an exposure with a blockout mask. Following this, as shown in FIG. 7.3, the robust BEOL dielectric is etched back in the regions not protected by the blockout mask and followed by a resist strip. Finally, the etched back regions are gap filled and planarized with a dielectric 550 with a lower k than the robust BEOL dielectric 600 as shown in FIG. 7.4. For example, the mechanically robust BEOL dielectric 600 can be selected from the group comprising silicon oxide, fluorinated silicon oxide, organosilicate dielectrics comprising silicon, carbon, oxygen and hydrogen. The gap fill dielectric 550 can be porous or dense versions of organosilicates and organic dielectrics such as polyimides and polyarylene ethers and porous silica with k<2.5 and preferably even lower than 2. Additionally, regions such as the chip kerf sites, bond or probe pads and the dicing channels can also be protected by the block out lithography to preserve the support dielectric to prevent dicing and bonding induced cracks. The block out mask and the associated lithography can be of fairly relaxed in ground rules compared to the minimum ground rule of the technology used to fabricate the cells and thus will not be significant cost adder. In this manner, it is possible to make mechanically robust hybrid structures wherein the k of the IMD in the WL/PL gaps is as high as 4 and the k of the IMD in the remaining interconnect regions is as low as 1.6. This enables an increased bootstrapping voltage in the SRAM cells enabled by the higher Cc values from the high k material while maintaining the high speed (low capacitance) for the interconnect wiring elsewhere on the chip.

In the second inventive method, we propose the fabrication of the interconnect structures with a low k dielectric 700 (such as porous and dense versions of organosilicates and organic dielectrics such as polyimides and polyarylene ethers and porous silica), protecting all the regions EXCEPT the WL/PL gap areas with a block out resist mask 100, etching the low k dielectric from between the WL/PL lines and gap filling and planarizing with a high k dielectric 750. This process flow is shown schematically in FIG. 8 (again omitting the interconnect lines for simplicity).

In this case it is possible to gap fill with very high k materials such as titania, zirconia, hafnia and their silicates, barium strontium titanate, barium zirconium titanate and the like which can be deposited by sol gel processing using metal alkoxide solutions, for example. k values as high as 20-40 are possible in these films significantly increasing the capacitance attainable between WL and PL. The overall interconnect capacitance and mechanical robustness will be determined by the low k dielectric used to fabricate the original structure before EBGF.

In the third inventive method, shown schematically in FIG. 9, the interconnects are fabricated using a robust support dielectric 600 with a moderate k, typically in the 2.5 to 4.0 range, FIG. 9.1 (note: interconnect lines are omitted for simplicity of illustration). This robust support dielectric 600 can be selected from the group comprising silicon oxide, fluorinated silicon oxide, organosilicate dielectrics comprising silicon, carbon, oxygen and hydrogen. In the first block out lithography, only the WL and PL regions of the SRAM areas are exposed while the remaining area is blocked out with a photoresist pattern 100 as shown in FIG. 9.2. A first etch back of the robust support dielectric 600 (FIG. 9.3) is performed followed by a gap fill with high k or ultra high k dielectrics 750 as in the first variant above followed by CMP planarization, FIG. 9.4. Dielectric 750 can thus be selected from the group comprising very high k materials such as titania, zirconia, hafnia and their silicates, barium strontium titanate, barium zirconium titanate and the like which can be deposited by sol gel processing using metal alkoxide solutions, for example. Next, a second block out photoresist pattern 110 is formed that protects all the SRAM WL/PL regions and the dicing channels and bond pads, FIG. 9.5. An etch back of the robust support dielectric 600 in the regions not protected by the block out pattern 110 (FIG. 9.6) followed by gap fill with low k or ultra low k dielectric 550 and planarization leads to interconnect areas which are very low in capacitance and hence wiring delay, FIG. 9.7. Dielectric 550 can be selected from the group comprising porous or dense versions of organosilicates and organic dielectrics such as polyimides and polyarylene ethers and porous silica with k<2.5 and preferably even lower than 2. The net structure of FIG. 9.7 combines the mechanical robustness afforded by the robust support dielectric 600, significantly reduced interconnect delay enabled by the ultra low k dielectric gap fill 550, and the very large capacitive coupling in the SRAM cell regions achieved through the high k or ultra high k gapfill dielectric 750 in that region. The cost of this variant is likely to be slightly more than the other two variants due to the additional steps required but a higher level of overall performance is achieved and will be justified where a cost premium for higher performance is acceptable.

In the fourth inventive method the low k or ultra low k IMD regions in the SRAM cell area alone are modified using a suitable exposure method selected from ion implantation, photon irradiation, chemical infiltration from liquid, vapor or supercritical fluid based delivery media followed by an optional thermal annealing. The base interconnect structure itself can be fabricated by the standard dual damascene technique or the EBGF technique as described earlier. Following the build of the interconnect structure, a block out lithography is performed to protect all the areas other than the SRAM cell area with a photoresist. Then the modification process is carried out that enables the conversion of the IMD to a higher k material. The block out resist is stripped and the process of additional layer build is continued with the dielectric modification step for the SRAM area included in additional interconnect levels as needed.

The structures resulting from the above described inventive methods have the higher interconnect capacitance in the cell areas of the SRAM desirable for the low voltage operation and the low to ultra low interconnect capacitance in the other areas desirable for high speed signal propagation and low interconnect power dissipation. Further, they incorporate a mechanically robust IMD in the dicing channels, bond pads and under all the interconnect lines thereby providing superior chip robustness.

What we claim is:

1. A method of fabricating a hybrid interconnect structure comprising the steps of:
   depositing a first dielectric and patterning trenches and vias in said first dielectric on a substrate;
   filling said trenches and vias with a conductive barrier and a higher conductivity fill material to form interconnect wiring structures;
   forming a first block out resist pattern to expose only a first set of interconnect wiring structures in a first region of the substrate wherein said first region includes SRAM cells;
   etching said first dielectric from between said first set of interconnect wiring structures located in said first region to form etched gaps and stripping the photoresist;
   filling the etched gaps between said first set of interconnect wiring structures with a second dielectric having a dielectric constant higher than that of the first dielectric and planarizing it to form a coplanar structure;
   forming a second blockout photoresist pattern that exposes a second region of the substrate comprising a second set of interconnect wiring structures wherein said second region comprises all the area except the SRAM cells, dicing channels and the bond and test pads;
   etching said first dielectric from between said second set of interconnect wiring structures to form etched gaps and stripping the photoresist;
   and filling the etched gaps between said second set of interconnect wiring structures with a third dielectric having a lower dielectric constant than that of the first dielectric and planarizing to form a coplanar structure.

2. A method according to claim 1 wherein said first dielectric is selected from the group comprising silicon oxide, fluorinated silicon oxide, organosilicate dielectrics comprising silicon, carbon, oxygen and hydrogen.

3. A method according to claim 1 wherein said second dielectric is selected from group comprising titania, zirconia, hafnia and their silicates, barium strontium titanate, barium zirconium titanate and the like.

4. A method according to claim 1 wherein said third dielectric is selected from the group comprising porous and dense versions of organosilicates and organic dielectrics.

5. A method to fabricate a hybrid interconnect structure comprising the steps of:
   depositing a first dielectric and patterning trenches and vias in said first dielectric on a substrate;
   filling said trenches and vias with a conductive barrier and a higher conductivity fill material to form interconnect wiring structures;
   protecting all areas other than an SRAM cell area with a block out resist pattern;
   treating the exposed SRAM cell region by a method selected from ion implantation, photon irradiation, chemical infiltration from liquid, vapor or supercritical fluid media thermal annealing and combinations thereof;
   resulting in the modification of the intermetal dielectric in said SRAM cell area to a higher dielectric constant so as to enable higher capacitive coupling between the interconnect wiring structures in said SRAM cell area;
   and stripping the blockout photoresist from the surface.

6. A method of fabricating a hybrid interconnect structure comprising the steps of:
   depositing a first dielectric and patterning trenches and vias in said first dielectric on a substrate;
   filling said trenches and vias with a conductive barrier and a higher conductivity fill material to form interconnect wiring structures;
   forming a block out resist pattern in a first region of the substrate to protect all areas other than SRAM cells and to expose only a first subset of said interconnect wiring structures;
   treating said first subset of said interconnect wiring structures by a method selected from ion implantation, photon irradiation, chemical infiltration from liquid, vapor or supercritical fluid media, thermal annealing and combinations thereof;
   resulting in the modification of the said first dielectric in said exposed area to convert it into a second dielectric with a higher dielectric constant so as to enable higher capacitive coupling between the interconnect wiring structures in said exposed region;
   and stripping the blockout photoresist from the surface;
   wherein said first dielectric is selected from the group comprising porous and dense versions of organosilicates and organic dielectrics such as polyimides and polyarylene ethers and porous silica; said conductive barrier material is selected from the group comprising tantalum and titanium, nitrides and silicon nitrides of tantalum and titanium and combinations thereof, and said higher conductivity fill material is selected from the group comprising copper, aluminum, gold, silver and combinations thereof.

7. A method to fabricate a hybrid interconnect structure comprising the steps of:
   depositing a first dielectric and patterning trenches and vias in said first dielectric on a substrate;
   filling said trenches and vias with a conductive barrier and a higher conductivity fill material to form interconnect wiring structures;
   forming a block out resist pattern in a first region of the substrate to protect all areas other than SRAM cells, dicing channels and areas used for bond and test pads and to expose only a first subset of said interconnect structures;
   etching said first dielectric from between said first set of interconnect wires located in said first region to form gaps;
   and filling the gaps between said first set of interconnect wires with a second dielectric having a higher dielectric constant than that of the first dielectric and planarizing it to form a coplanar structure.

8. The method according to claim 7 wherein said conductive barrier material is selected from the group comprising tantalum and titanium, nitrides and silicon nitrides of tantalum and titanium and combinations thereof.

9. The method according to claim 7 wherein said higher conductivity fill material is selected from the group comprising copper, aluminum, gold, silver and combinations thereof.

10. The method according to claim 7 wherein the steps are repeated to produce a multilevel hybrid interconnect structure.

11. The method according to claim 7 wherein said first dielectric is a low k or ultra low k dielectric selected from the group comprising porous and dense versions of organosilicates and organic dielectrics.

12. The method according to claim 11 wherein said second dielectric is a high k dielectric selected from the group comprising silicon oxide, fluorinated silicon oxide, titania, zirconia, hafnia and their silicates, barium strontium titanate, barium zirconium titanate and the like.

* * * * *